(12) United States Patent
Sunstein

(10) Patent No.: US 6,411,234 B1
(45) Date of Patent: Jun. 25, 2002

(54) CONTINUOUS INPUT SELECTOR SWITCH

(76) Inventor: Drew E. Sunstein, 6 Prentis Way, Exeter, NH (US) 03833

( * ) Notice: Subject to any disclaimer, the term of this patent is extended or adjusted under 35 U.S.C. 154(b) by 0 days.

(21) Appl. No.: 09/686,462

(22) Filed: Oct. 11, 2000

Related U.S. Application Data

(60) Provisional application No. 60/158,814, filed on Oct. 12, 1999.

(51) Int. Cl.[7] ............................ H03M 1/00; H03M 1/12
(52) U.S. Cl. ...................................... 341/126; 341/155
(58) Field of Search .................. 341/126, 155, 341/156; 172/4; 235/615; 324/115; 334/1; 33/366.14

(56) References Cited

U.S. PATENT DOCUMENTS

| | | | | |
|---|---|---|---|---|
| 4,200,850 A | * | 4/1980 | Valdettaro | 334/1 |
| 4,244,117 A | * | 1/1981 | Cantarella et al. | 33/366.14 |
| 5,923,161 A | * | 7/1999 | Frankovitch et al. | 324/115 |
| 6,085,846 A | * | 7/2000 | Buchl et al. | 172/4 |

* cited by examiner

*Primary Examiner*—Patrick Wamsley
(74) *Attorney, Agent, or Firm*—Bromberg & Sunstein LLP

(57) ABSTRACT

A selector switch in which an input obtained from a range of continuous analog signals is used to select from one of a set of discrete selections. Each selection is assigned a specified range of analog signals. Each range is separated from an adjoining range by a guard band of signals. A determination is made as to whether the input analog signal is within one of the specified ranges of analog signals. If so, a sector indicator is set to correspond to the specified range. Otherwise, the sector indicator is not changed.

11 Claims, 2 Drawing Sheets

CONTINUOUS INPUT SELECTOR SWITCH

This application claims priority from U.S.Provisional Application Ser. No. 60/158,814, filed Oct. 12, 1999, the full disclosure of which is hereby incorporated by reference herein.

BACKGROUND OF THE INVENTION

The present invention is in the field of selector switches.

Typically switches used for selecting one of a plurality of modes will make a different electrical connection for each of the modes. On the other hand, potentiometers, whether a rotary dial or linear slide, are typically used to provide amplitude control over a continuously changing signal. The potentiometer gives the user the ability to make adjustments over a continuous range of amplitudes for the signal. The potentiometer knob may be interengageable with physical detentes at various locations in the potentiometer travel to mark off various levels of the signal. The user is thus given a physical feedback as the size of the signal is changed.

SUMMARY OF THE INVENTION

In accordance with an embodiment of a method of the invention, an input is obtained from a range of continuous analog signals. Each of a set of discrete selections is assigned a specified range of analog signals. Each range is separated from an adjoining range by a guard band of signals. A sector indicator is a variable having a value indicative of one of the discrete selections to be selected by the switch. The sector indicator is initialized. An input analog signal is received and a determination is made as to whether the input analog signal is within one of the specified ranges of analog signals. If so, the sector indicator is set to correspond to the specified range. Otherwise, the sector indicator is not changed. The sector indicator may be used to illuminate one of a plurality of lights to give the user feedback indicating which sector has been selected.

According to an apparatus embodiment for performing the method, a potentiometer and a state machine are employed to achieve a selector switch. The state machine sets the sector indicator and only changes the sector indicator when the signal from the potentiometer crosses into the specified range for a sector having a different sector indicator. No change is made to the sector indicator while the potentiometer produces an output signal corresponding to a guard band.

DETAILED DESCRIPTION OF THE PREFERRED EMBODIMENTS

Figure 1:
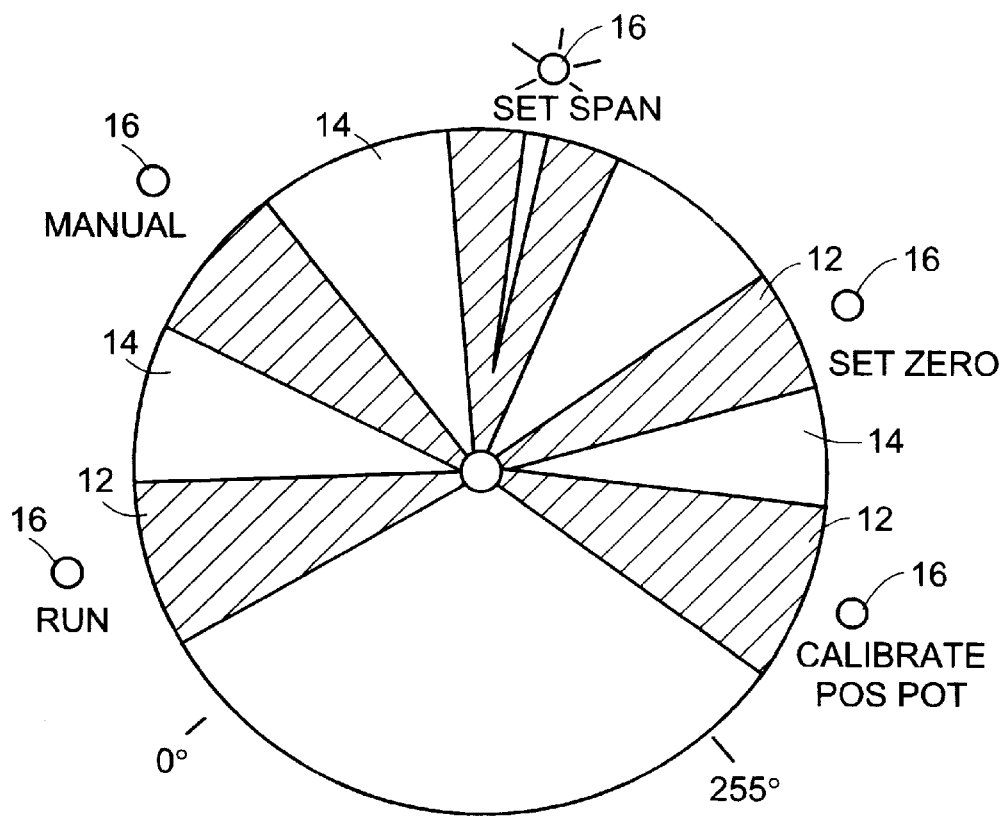
FIG. 1 is a schematic diagram of knob potentiometer for use as a selector switch of an embodiment of the invention.

A selector switch of an embodiment of the invention is used to select from a set of discrete selections. Referring to FIG. 1, a rotary knob potentiometer 10 is used to select from five selections: RUN, MANUAL, SET SPAN, SET ZERO, CALIBRATE POS POT. In accordance with embodiments of the present invention, a continuous analog input device such as a potentiometer, is used to choose among the set of discrete selections. The input device may be any of a number of continuous analog input devices including a rotary knob potentiometer or a linear slide potentiometer or other such device. The knob potentiometer of FIG. 1 is operable over 255° of rotation.

An algorithm for reading the input from the potentiometer 10 assigns a specified range 12 to each of the discrete selections. For example, each selection may have a 40° range attributed to that selection. In between each of the specified ranges 12 for the selections are unassigned guard band regions 14. When the potentiometer is rotated into one of the guard bands 14, the selection does not change. The selection only changes when the specified range 12 of a new selection has been reached by the potentiometer. This hysteresis with respect to the guard band avoids twitchy behavior between selections.

Since the potentiometer is a continuous input device, there is little indication to the user which selection has been made. This is usually solved by providing a visual indicator for each of the discrete selections. This may simply be a printed indicia adjacent the potentiometer to indicate which selection has been made. However, because of the hysteresis, this solution may be unsatisfactory and not adequately reliable. Therefore, in accordance with an embodiment of the invention, a light, for example a light-emitting diode (LED) 16 is provided at each of the discrete selections made available by the potentiometer. The chosen selection is indicated to the user by the illuminated light. Only one light 16 is illuminated at a time. The light is illuminated to show the sector that has been selected by the potentiometer.

Figure 2:
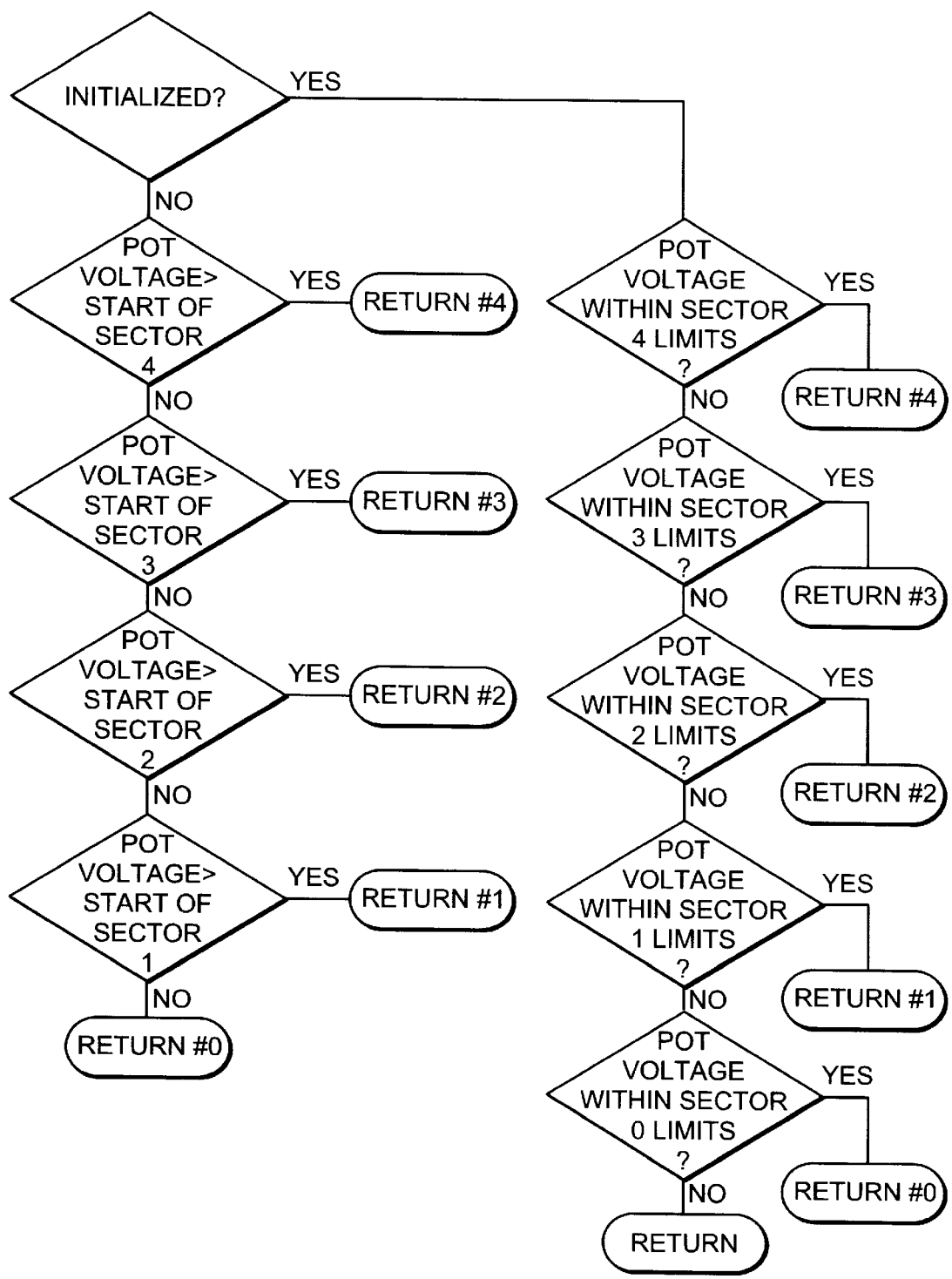
FIG. 2 is a flowchart for use with the potentiometer of FIG. 1.

Referring now to FIG. 2, a flow chart of an algorithm for determining the sector indicated by an input from a continuous range of signals, is shown. The flow chart performs a state machine algorithm to indicate the value of a sector indicator. The algorithm first gives an initial value to the sector indicator. The initial value will typically be selected based on proximity of the analog input signal to one of the specified ranges. In accordance with a preferred embodiment for initializing the sector indicator, if the pot is set above the lower boundary of the highest sector, then the sector indicator is set to correspond to that highest range of continuous analog signals. During initialization, the algorithm checks the lower boundary of each specified range from the highest range to the lowest range. The sector signal is set to the first specified range of analog signals whose lower level above which the potentiometer has been set. If the pot is not above any of the lower limits, the sector indicator will be initialized at the lowest specified range of signals. Thereafter, the state machine algorithm receives the position of the potentiometer and compares it with the specified ranges for the available discrete selections. The state machine thereafter maintains the sector indicator at its current value until the analog signal received from the potentiometer enters a specified range of signals for a different sector. When the potentiometer has been turned into a different sector, the sector indicator changes to correspond to the new specified range. Thus, the sector selected when the potentiometer is in a guard band depends upon which specified range the potentiometer last was in.

In accordance with conventional methods, the analog input signal from the potentiometer can be converted to a digital signal. The digital signal is then put into a processor that is running the state machine algorithm. The digital input can thus be compared with digital limits corresponding to the analog limits of the various specified ranges. The sector indicator output from the state machine can be advantageously used to illuminate a light indicating the sector that has been selected. This provides the user with immediate feedback as to which sector has been selected by rotation or sliding of the potentiometer.

The state machine having determined the sector may use the sector indicator or additional outputs for putting the processor or other devices into the selected mode. Thus, actions may take place in response to the mode selection.

Of course, it should be understood that various changes and modifications to the preferred embodiments described above will be apparent to those skilled in the art. For example, the number of specified ranges may be altered within reasonable limits to convert a continuous signal output into a selector switch. Such changes can be made without departing from the spirit and scope of the invention and without diminishing its attendant advantages. It is, therefore, intended that such changes and modifications be covered by the following claims.

I claim:

1. A selector switch comprising:

a potentiometer that produces a continuous range of analog signals; and a state machine for interpreting an analog signal from said potentiometer as one of a set of discrete selections wherein each selection corresponds to a specified range of signals from said potentiometer, each specified range separated by a guard band of signals and said state machine outputting a selected selection until the analog signal from said potentiometer comes within the specified range of another selection.

2. The selector switch of claim 1 further comprising a plurality of lights, one for each of said discrete selections, located around said potentiometer to identify the set of discrete selections.

3. The selector switch of claim 2 wherein said plurality of lights are responsive to said state machine so as to turn on to identify the output selected selection.

4. The selector switch of claim 1 further comprising indicia adjacent said potentiometer for visually identifying the set of discrete selections.

5. A method for converting an input from a range of continuous analog signals into one of a set of discrete selections comprising:

initializing a sector indicator;

receiving the input analog signal;

determining whether the input analog signal is within one of a plurality of specified ranges of analog signals, wherein each of the discrete selections corresponds to one of the specified ranges and each range being separated from any adjoining range by a guard band of signals, and if so setting the sector indicator to correspond with the specified range; and maintaining the sector indicator if the input analog signal is not within one of the specified ranges.

6. The method of claim 5 further comprising illuminating one of a plurality of lights corresponding to the sector indicator.

7. The method of claim 5 wherein the input analog signal is received from a potentiometer.

8. The method of claim 5 wherein said act of determining comprises converting the input analog signal to a digital signal and comparing the digital signal with digital ranges corresponding to the specified ranges of analog signals.

9. The method of claim 5 wherein said act of initializing the sector indicator comprises checking whether the input analog signal exceeds a lower boundary of each specified range from the highest range to the lowest range and assigning the sector indicator a value corresponding to the first range for which the input analog signal exceeds the lower boundary of the range.

10. A state machine for use in converting an input from a range of continuous analog signals into one of a set of discrete selections comprising:

an input for receiving a signal indicative of the input analog signal;

an output providing a value for a sector indicator corresponding to one of the set of discrete selections;

program code for determining whether the signal is within one of a plurality of specified ranges, wherein each of the discrete selections corresponds to one of the specified ranges and each range being separated from any adjoining range by a guard band, and if the signal is within one of the plurality of specified ranges setting the sector indicator to correspond with the specified range and if not maintaining the value of the sector indicator.

11. The method of claim 10 further comprising program code for initializing the sector indicator by checking whether the input analog signal exceeds a lower boundary of each specified range from the highest range to the lowest range and assigning the sector indicator a value corresponding to the first range for which the input analog signal exceeds the lower boundary of the range.

* * * * *